(12) United States Patent
Akita et al.

(10) Patent No.: US 7,638,910 B2
(45) Date of Patent: Dec. 29, 2009

(54) ELECTRIC ROTATING MACHINE

(75) Inventors: Hiroyuki Akita, Tokyo (JP); Masaki Kato, Tokyo (JP); Yoshihito Asao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 294 days.

(21) Appl. No.: 11/659,712

(22) PCT Filed: Jan. 26, 2006

(86) PCT No.: PCT/JP2006/001227

§ 371 (c)(1),
(2), (4) Date: Feb. 8, 2007

(87) PCT Pub. No.: WO2006/080397

PCT Pub. Date: Aug. 3, 2006

(65) Prior Publication Data

US 2007/0257568 A1 Nov. 8, 2007

(30) Foreign Application Priority Data

Jan. 28, 2005 (JP) .............................. 2005-021433

(51) Int. Cl.
*H02K 9/00* (2006.01)
(52) U.S. Cl. ..................... 310/68 D; 310/71; 310/64
(58) Field of Classification Search ............... 310/68 D, 310/68 R, 71, 64, 254, 261
See application file for complete search history.

(56) References Cited

U.S. PATENT DOCUMENTS

| | | | | |
|---|---|---|---|---|
| 6,307,289 B1 * | 10/2001 | Skala | ...................... | 310/68 D |
| 7,075,201 B2 * | 7/2006 | Takahashi et al. | ......... | 310/68 D |
| 7,414,339 B2 * | 8/2008 | Kitamura et al. | .......... | 310/68 D |
| 2003/0173839 A1 * | 9/2003 | Torii et al. | ..................... | 310/52 |
| 2004/0183385 A1 * | 9/2004 | Takahashi et al. | ......... | 310/68 D |
| 2007/0188119 A1 * | 8/2007 | Sonoda et al. | .............. | 318/254 |

FOREIGN PATENT DOCUMENTS

| | | |
|---|---|---|
| JP | 2-119559 A | 5/1990 |
| JP | 11-121691 A | 4/1999 |

(Continued)

OTHER PUBLICATIONS

Microfilm of the Specification and Drawings Annexed to the Request of Japanese Utility Model Application No. 15289/1990 (Laid-Open No. 106868/1991) (Sawafuji Electric Co., Ltd.), Nov. 5, 1991. p. 6 line 15 to p. 14, line 9; Figs. 1 to 7.

*Primary Examiner*—Thanh Lam
(74) *Attorney, Agent, or Firm*—Sughrue Mion, PLLC (57) ABSTRACT

The invention provides an electric rotating machine comprising: an electric rotating machine section provided with a rotor including a rotary shaft and a stator including an armature winding that is disposed so as to surround the rotor; and a switching circuit section that is located in the proximity of the electric rotating machine section, and is provided with at least one pair of switching elements forming an upper arm and a lower arm to make a switching control of the electric rotating machine section; and in which the switching elements of each arm of the switching circuit section are connected at respective drain terminals to individual heat sinks with no insulator interposed, and the individual heat sinks are made integral with each other via an insulator.

9 Claims, 7 Drawing Sheets

FOREIGN PATENT DOCUMENTS

| JP | 2003-225000 A | 8/2003 |
| JP | 2004-22844 | 1/2004 |
| JP | 2004-274992 A | 9/2004 |
| JP | 2004-282905 A | 10/2004 |
| JP | 2004-312852 A | 11/2004 |

* cited by examiner

PRIOR ART

ELECTRIC ROTATING MACHINE

TECHNICAL FIELD

The present invention relates to an electric rotating machine onto which a power element unit making, e.g., an inverter control is mounted and, more particularly, to a vehicle electric rotating machine with an integrated inverter for use in motor generators and power steering motors.

BACKGROUND ART

Conventionally, a power element unit making an inverter control of an electric rotating machine has been generally located apart from the electric rotating machine. Therefore, an AC wiring for providing an electrical connection between the power element unit and the electric rotating machine becomes longer, and thus a voltage drop is increased due to wiring resistance, so that a problem exists in that torque and velocity of the electric rotating machine are decreased. In particular, in a vehicle electric rotating machine with a power supply at low voltage of 12V and 36V, the influence of this voltage drop is large. For example, on the supposition of voltage drop of 0.5V, there is a loss of approximately 4% power supply voltage. Moreover, although measures of making wires thicker can be conceived for suppressing voltage drop, a problem exists in that weight of routing wires is increased, and thus costs are increased.

Furthermore, even if it is not an electric rotating machine of a low voltage power supply, when any power element unit and any electric rotating machine are disposed spaced apart from each other, it is necessary to provide with a long wiring. Thus, not only the layout of products is restricted, but also cost of wiring parts or assembling cost is increased.

To overcome this, for example, as shown in Patent Document 1 (the Japanese Patent Publication (unexamined) No. 225000/2003), a technique in which a control device is integrally mounted onto a vehicle electric rotating machine is considered. Due to that the control device is mounted on a rear bracket as an integral part, it is certainly possible to shorten harnesses to use for connection, to suppress voltage drop to improve torque characteristics or revolution number characteristics of an electric rotating machine, and further to avoid the increase of weight or the increase of cost.

However, as shown in the Patent Document 1 (claim 5, paragraph number [0039], FIG. 4 or the like), to dispose a control device in the vicinity of an electric rotating machine, it is necessary to ensure heat dissipation of a power element. Nevertheless, since the electric rotating machine itself generates heat, temperature environments therearound become tough. Further, due to that a control circuit containing power elements, being heating elements, is located in the vicinity of the electric rotating machine, temperatures further rise, resulting in a problem of destruction of the power element or the control element. Moreover, since a power element unit is added and mounted in a space of the electric rotating machine, a further problem exists in that the whole device becomes larger.

Figure 13:
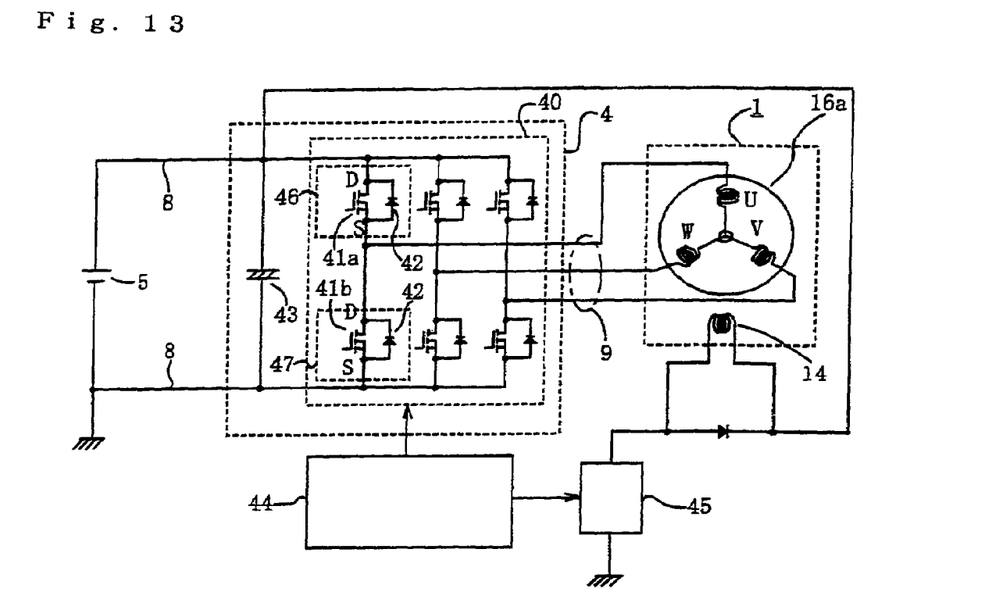
FIG. 13 is a schematic circuit diagram for operation of an electric rotating machine.

FIG. 13 is a schematic circuit diagram for explaining operation of an electric rotating machine provided with a power element unit. In the diagram, an electric rotating machine 1 is provided with an armature winding 16a wound around a stator, and a field winding 14 wound around a rotor. The mentioned armature winding 16a is constructed of three phases (U-phase, V-phase, and W-phase) of coils in Y-connection (star-connection). A power element unit 4 is provided with an inverter module 40 that is formed of a plurality of switching elements, being power elements (power transistor, MOSFET, IGBT and the like) 41 and diodes 42 connected in parallel to each of the switching elements 41, and a capacitor 43 that is connected in parallel to this inverter module 40. In the inverter module 40, letting a pair of the switching element 41a and diode 42 forming an upper arm 46 and the switching element 41b and diode 42 forming a lower arm 47 that are connected in series one set, these three sets are connected in parallel.

The ends of each phase of Y-connection in the armature winding 16a are electrically connected to intermediate points between the mentioned switching elements 41a of the upper arm 46 and the switching elements 41b of the lower arm 47 that are located in series via an AC wiring 9. Furthermore, a positive electrode terminal and a negative electrode terminal of a battery 5 are electrically connected to the positive electrode side and negative electrode side of the inverter module 40 via a DC wiring 8 respectively. In the inverter module 40, the switching operation of each of the switching element 41a and 41b is controlled by commands from a control circuit 44. Further, the control circuit 44 controls a field current control circuit 45 to adjust a field current to flow through the field winding 14 of the rotor.

In the electric rotating machine 1 provided with the power element unit 4 as mentioned above, at the time of starting the engine, a DC power is supplied to the power element unit 4 via the DC wiring 8 from the battery 5. Then, the control circuit 44 makes ON/OFF control of each of the switching elements 41a and 41b of the inverter module 40, and a DC power is converted to a three-phase AC power. Subsequently, this three-phase AC power is supplied to the armature winding 16a of the electric rotating machine 1 via the AC wiring 9. Accordingly, a rotating magnetic field is formed around the field winding 14 of the rotor through which a field current is carried by means of the field current control circuit 45, the rotor is driven to rotate, and then the engine is started via a pulley for the electric rotating machine, a belt, a crank pulley, and a clutch (ON).

When an engine is started, a rotational power of the engine is transmitted to the electric rotating machine 1 via the crank pulley, belt, and pulley for the electric rotating machine. Accordingly, the rotor is driven to rotate resulting in induction of a three-phase AC voltage at the armature winding 16a. Then, the control circuit 44 makes ON/OFF control of each of the switching elements 41, the three-phase AC voltage having been induced at the armature winding 16a is converted to a DC power, and the battery 5 is charged.

Figure 14:
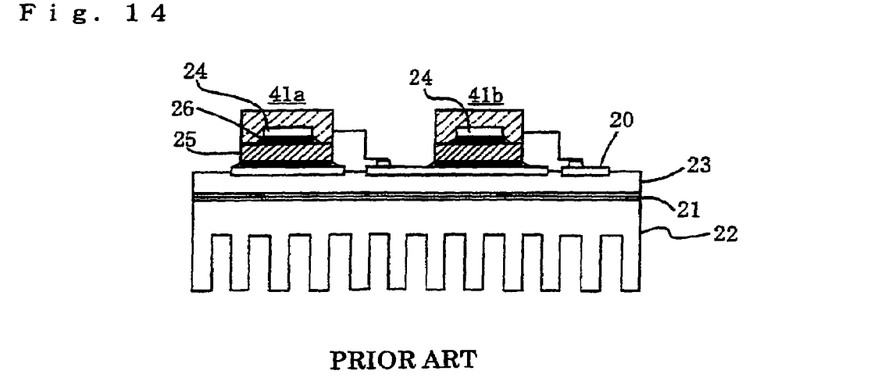
FIG. 14 depicts a conventional device showing connection of switching element.

Now, an example of a construction of a conventional power module for use in the mentioned power element unit 4 is shown in FIG. 14. The power element 41a forming the upper arm 46 and the power element 41b forming the lower arm 47 are connected to a metal substrate 20, and further connected to a heat sink 22 via a radiation grease 21. The connection part between the two power elements 41a and 41b is connected to an AC wiring 9, so that they include different potentials respectively, thus being insulated on an insulating substrate 23. Heat of the power elements 41a and 41b is transferred to the heat sink 22 via the insulating substrate 23, and is radiated in air. An electric heat path of the power elements is formed of a chip 24, being a heating element, a heat spreader 25 acting as a connection element to the outside, and a solder 26 providing connection therebetween. Respective heat conductivities are 0.0254 W/m·K, 0.0293 W/m·K, and 0.0165 W/m·K.

On the other hand, a heat conductivity of the insulating substrate 23 is 0.07 to 0.09 W/m·K. Since an insulator is interposed in heat transfer path, heat dissipation is largely impaired.

As described above, to dispose an inverter in the vicinity of an electric rotating machine, it is essential to ensure heat dissipation of a power element. Nevertheless, an electric rotating machine generates heat, so that temperature environments therearound are tough. Further, due to that a control device containing power elements, being heating elements, is located in the vicinity of the electric rotating machine, temperatures further rise, resulting in a problem of destruction of the power element or control element.

DISCLOSURE OF INVENTION

Problems to be Solved by the Invention

The present invention was made to solve problems as described above, and has an object to improve a cooling performance of the control device, and to downsize the whole device and thus to eliminate loss of voltage drop due to wiring between the control device and an electric rotating machine.

MEANS FOR SOLUTION TO THE PROBLEMS

An electric rotating machine according to the present invention includes: an electric rotating machine section provided with a rotor including a rotary shaft and a stator including an armature winding that is disposed so as to surround the mentioned rotor; and a switching circuit section that is located in the proximity of the mentioned electric rotating machine section, and is provided with at least one pair of switching elements forming an upper arm and a lower arm to make a switching control of the mentioned electric rotating machine section; and in which the switching elements of each arm of the mentioned switching circuit section are connected at respective drain terminals to individual heat sinks with no insulator interposed, and the mentioned individual heat sinks are made integral with each other via an insulator.

EFFECT OF THE INVENTION

In the electric rotating machine according to the invention, the insulating layer between switching elements, being power elements, and the heat sinks becomes unnecessary, so that it is possible to improve heat conductivity. As a result, amount of heat radiation of the switching elements is increased, and thus a cooling performance of the power element unit is improved. Furthermore, the heat sinks can be used as a part of wiring, so that it is possible to decrease the number of wiring parts, further to downsize a wiring board itself as well, and thus to achieve downsizing of the whole device.

BEST MODE FOR CARRYING OUT THE INVENTION

Preferred embodiments for carrying out the present invention are hereinafter described referring to the drawings.

Embodiment 1

Figure 1:
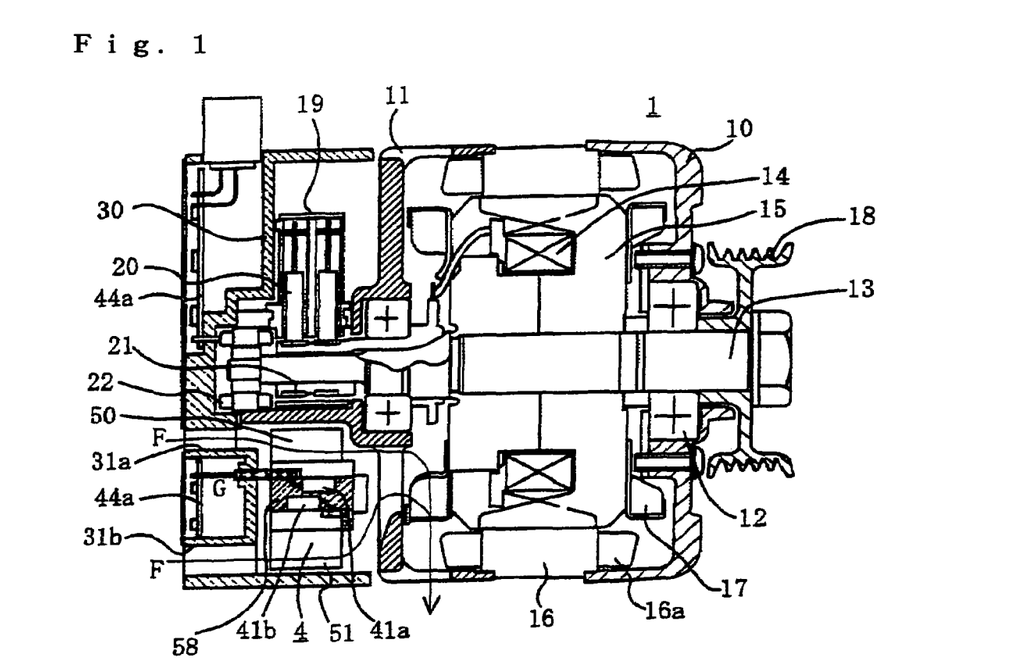
FIG. 1 is a cross-sectional view showing a structure of an electric rotating machine according to a first embodiment of the invention.

FIG. 1 is a cross sectional view showing a structure of an electric rotating machine according to a first embodiment of the invention. This electric rotating machine has a power element mounted as an integral part or located in the proximity.

With reference to FIG. 1, an electric rotating machine 1 comprises: a case formed of a front bracket 10 and a rear bracket 11; a shaft 13 rotatably mounted onto this case via a supporting bearing 12; a rotor 15 that is fixed to this shaft 13, and includes a field winding 14; a stator 16 that is fixed to the mentioned case and located so as to surround the rotor 15, and that includes an armature winding 16a; a fan 17 that is fixed to two axial end faces of the rotor 15; a pulley 18 that is fixed to the front-side end portion of the shaft 13; a brush holder 19 that is attached to the rear bracket 11 so as to be positioned on the rear-side perimeter of the shaft 13; a pair of brushes 20 that is located in the brush holder 19 so as to be slidingly adjacent to a pair of slip rings 12 that are mounted on the rear side of the shaft 13; and a rotational position detection sensor (e.g., resolver) that is mounted on the rear-side end portion of the shaft 13. Further, this electric rotating machine 1 is connected to a rotary shaft of an engine (not shown) via a pulley 18 and a belt (not shown).

In this first embodiment, a power element unit 40 is provided as an integral part or in the proximity of the electric rotating machine 1. That is, in a space between a cover 30 located on the rear side of the rear bracket 11 and the rear bracket 11, a plurality of power elements (switching elements) 41a and 41b, and an inside heat sink 50 and outside heat sink 51 connected to each of the power elements 41 that form the power element unit 4 are provided on the outside surface of the rear bracket 11 via supports (not shown). Furthermore, a control circuit board 44a on which the above-described control circuit 44 is mounted is provided outside the cover 30.

Figure 2:
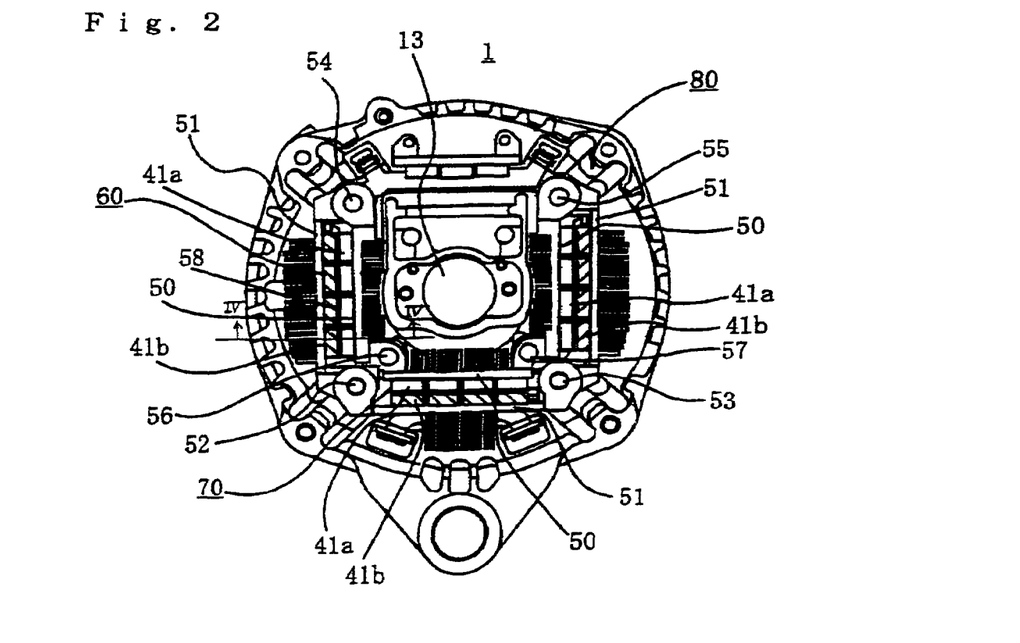
FIG. 2 is a top view of the power element unit 4 of FIG. 1.

Further, ventilation holes 31a and 31b are provided in the cover 30 and the rear bracket 11. By rotation of the fans 17 of the rotor 15, an airflow course as indicated by the arrow F in the drawing is formed. Air flows through an internal part of the cover 30 to cool the power elements 41, inside heat sink 50, outside heat sink 51, control circuit 44 and the like. FIG. 2 shows a view taken from above the top of the power element unit 4. The power circuit part is divided into sections of three phases of U, V, and W (U-phase section 60, V-phase section 70, and W-phase section 80). In each of these sections, the inside heat sink 50 and outside heat sink 51, being a pair of heat sinks, is mounted. Further, four power elements 41a (hollow parts shown in the drawing) of the upper side arm are connected parallel to the inside heat sink 50 forming a circuit; and another four power elements 41b (diagonally shaped parts in the drawing) of the lower side arm are connected parallel to the outside heat sink 51. The power elements 41 may be any of discrete type, TPM type, and bare chip type.

In this manner, as a result of connecting the plurality of switching elements 41 in parallel, a current-carrying capacity per switching element 41 can be made smaller, and manufactured inexpensively. Between the inside power elements 41a and heat sink 50 and the outside power elements 41b and heat sink 51, an insulator 58 such as synthetic resin acting to provide insulation therebetween is interposed. The two heat sinks 50 and 51 are fixed via the insulator 58. Therefore, even if a potential difference is generated between the upper and lower heat sinks, owing to the interposition of the insulator, it is possible to shorten a distance between the heat sinks and to achieve downsizing.

In addition, numeral 52 designates a fixing part to fasten together the outside heat sinks of U-phase and V-phase; and likewise numeral 53 designates a fixing part to fasten together the outside heat skinks 51 of V-phase and W-phase. Numeral 54 designates a fixing part to fasten together the outside heat sink 51 of U-phase and the inside heat sink 50 of U-phase; and likewise numeral 55 designates a fixing part to fasten together the outside heat sink of W-phase and the inside heat sink 50 of W-phase. Further, numeral 56 designates a fixing part to fasten together the inside heat sink 50 of U-phase an the inside heat sink 50 of V-phase; and numeral 57 designates a fixing part to fasten together the inside heat sink 50 of V-phase and the inside heat sink 50 of W-phase.

Figure 3:
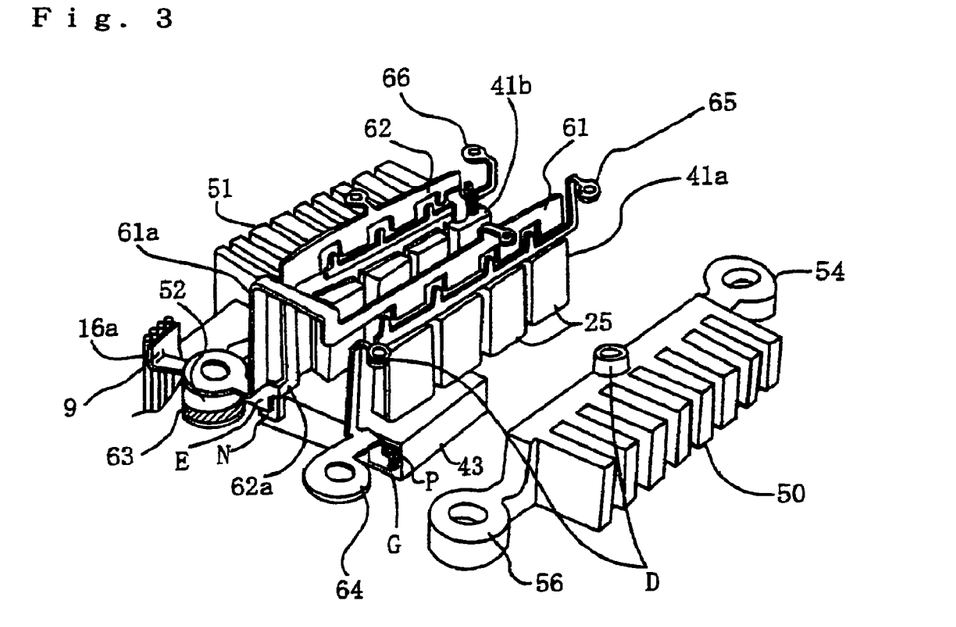
FIG. 3 is an exploded view of an assembly a controlling main circuit portion of an electric rotating machine.

Now, with reference to an exploded view of an assembly of a controlling main circuit portion of an electric rotating machine shown in FIG. 3, the layout of these power elements 41a and 41b, inside heat sink 50, outside heat sink 51 and the main circuit wiring structure is described in detail. The description is hereinafter made referring to a schematic circuit diagram for explaining operation of an electric rotating machine shown in FIG. 13. First, as for the power elements 41a forming an upper arm 46, four MOSFETs are connected with a base board 25 acting as a drain terminal thereof, e.g., soldered to the inside heat sink 50. On the other hand, as for the power elements 41b forming a lower arm 47, not shown, likewise four MOSFETs are connected with a base board acting as a drain terminal thereof, e.g., soldered to the outside heat sink 51. Accordingly, each of the heat sinks will have the same potentials as those of drain terminals to which they are joined respectively.

Meantime, a source terminal S of the power element 41a is distributed into four terminals in common with a wiring board 61. One end terminal thereof is connected in common to an outside heat sink 51 of the lower arm 47, that is, to a drain terminal of the power element 41b via a connecting wiring layer 61a, as well as is connected via an AC wiring 9 to a U-phase lead wire of the armature winding 16a of the stator 16. Furthermore, a source terminal S of the power element 41b is distributed into four terminals with a wiring board 62. One end terminal thereof is extended to the fixing part 52 for fastening the outside heat sinks 51 together via an extension wiring layer 62a to be fastened to the U-phase heat sink 51 together with the connecting wiring layer 61a of the U-phase wiring board 61, as well as is grounded itself through an earth part (e.g., bracket). Wiring boards of each layer are connected to respective earth parts in the vicinity, thereby enabling to making the wiring boards smaller.

Further, in the conventional device as shown in FIG. 14, wiring is required to provide the electrical connection between power elements (switching elements) 41a and 41b of the upper arm 46 and the lower arm 47. According to this first embodiment, however, the heat sinks 50 and 51 also functions as wiring. For example, the upper arm 46 of U-phase is mounted with four switching elements 41a, and to connect these four drain terminals in parallel, routing with, e.g., any copper wire is not made, but four switching elements 41a are directly connected to the heat sink 50, thereby providing the electrical connection in parallel. Likewise, drain terminals of the power elements (switching elements) 41b of the lower arm 47 are connected in parallel. Furthermore, the power elements (switching elements) of V-phase and W-phase are electrically connected in the same manner. That is, due to that the heat sinks 50 and 51 function as wiring as well, it is possible to achieve a smaller scale of wiring of, e.g., copper wire, thus to obtain a smaller-sized power element unit itself.

In addition, one fixing part 54 for fastening together of the mentioned inside heat sink 50 is connected to a positive electrode terminal of a battery 5, and the other fixing part 56 for fastening together fastens together to fix a wiring board 64 as shaped in the drawing to form a drain terminal D, as well as forms a connection to a capacitor 43 as described below. The layouts of power element units in a V-phase section 70 and a W-phase section 80 are constructed in the same manner as in the U-phase section 60. The inside heat sinks 50 in three sections (U-phase, V-phase, and W-phase sections) are at the same potential (at the positive electrode-side potential of the battery 5). Accordingly, there is provided no terminal for connection to the battery 5 at respective inside heat sinks 50, but there is formed a drain terminal D at a part of the surfaces of the mentioned inside heat sinks 50, whereby the inside heat sinks 50 are electrically connected to each other, enabling to decrease the number of battery connection terminals. In addition, four gate terminals 65 of the power elements 41a and four gate terminals 66 of the power elements 41b are commonly distributed respectively, and led to a control circuit board 44a located outside of the external cover 30 shown in FIG. 1 with cables, not shown.

Now, mounting of a capacitor 43 is described. The capacitor 43 has a rectangular parallelepiped shape as shown in the drawing, and is located so that a longitudinal face thereof comes along the back face of the mentioned heat sink structure in respect of a space factor. Furthermore, P and N terminals are led out from one end face thereof. There is provided a capacitor mounting part E, which is a part of the extension wiring layer 62a of the source-side wiring board 62 of the power elements 41b, and has a face parallel to cooling fins of the outside heat sink 51 in the front of the fixing part 52 for fastening together the outside heat sinks 51; and there is provided a capacitor mounting part G, which has a face parallel to cooling fins of the inside heat sink 50, also at a part of the wiring board 64 to be led out of the fixing part 56 for fastening together the inside heat sinks 50. The mentioned capacitor mounting part E and capacitor mounting part G are connected by soldering to N-terminal of the capacitor and P-terminal of the capacitor respectively.

As described above, since the capacitor for smoothing is located between the wiring board 64 connected to the inside heat sink having a positive electrode potential and the wiring board 62 connecting a negative electrode potential in each phase, the space factor for mounting the above-mentioned capacitor is improved, and a distance between the capacitor and the power circuit comes to be shorter. Thus the area of a path (loop diameter) of current that may flow from the capacitor through both of the power elements 41a and 41b is decreased. Consequently, it is possible to reduce the amount of an external magnetic field from the armature winding 16a that passes through the mentioned current path, and to obtain an electric rotating machine having high noise immunity.

Additionally, since the mentioned capacitors 43 for smoothing are located individually in respective phases, improvement in noise immunity can be achieved all over the phases.

Figure 4:
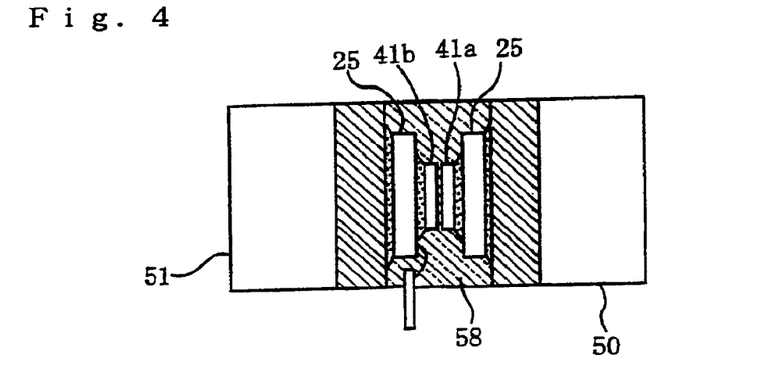
FIG. 4 is a cross-sectional view taken along the line IV-IV of FIG. 2.

FIG. 4 is a cross sectional view taken along the line IV-IV in FIG. 2. As is obvious from the drawing, the power element 41a of the upper-side arm is directly connected by soldering at the drain side thereof to the inside heat sink 50 via a heat spreader 25; and likewise, the power element 41b of the lower-side arm is connected by soldering at the drain side thereof to the outside heat sink 51. Further, the space therebetween is sealed with an insulator 58 thus forming an integral structure. That is, in the power module construction according to this first embodiment, individually different heat sinks (inside heat sink 50 and outside heat sink 51) are directly connected to the power elements (switching elements) 41a and 41b of the upper arm 46 and the lower arm 47, and the space between these different heat sinks (inside heat sink 50 and outside heat sink 51) is insulated through an insulator, thus being formed into a single-piece construction. Accordingly, it comes to be unnecessary to interpose an insulator having a large heat resistance between the power elements (switching elements) 41 and the heat sinks 50 and 51, thus enabling to improve heat dissipation.

Embodiment 2

Figure 5:
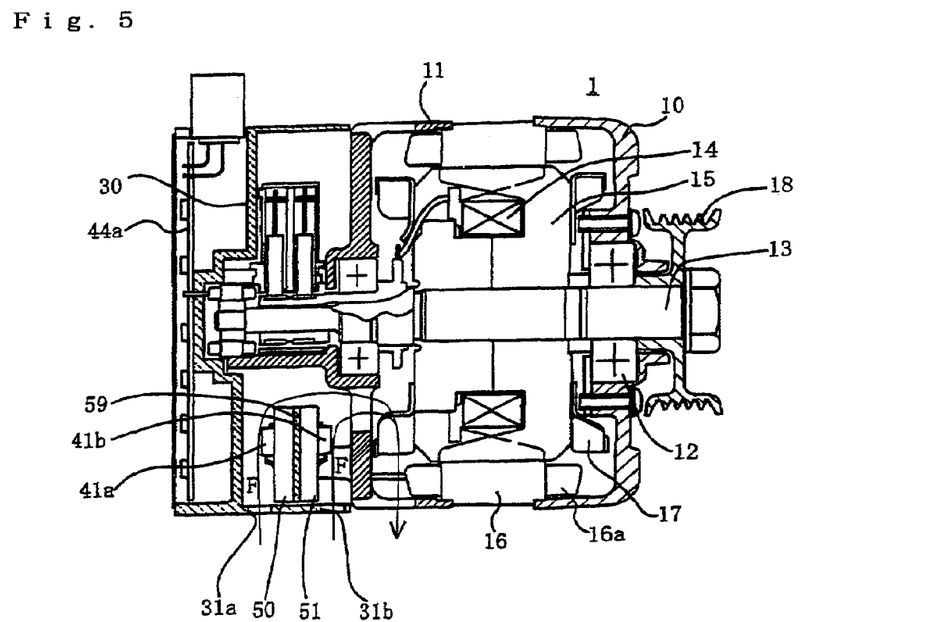
FIG. 5 is a cross-sectional view showing a structure of an electric rotating machine according to a second embodiment of the invention.
Figure 6:
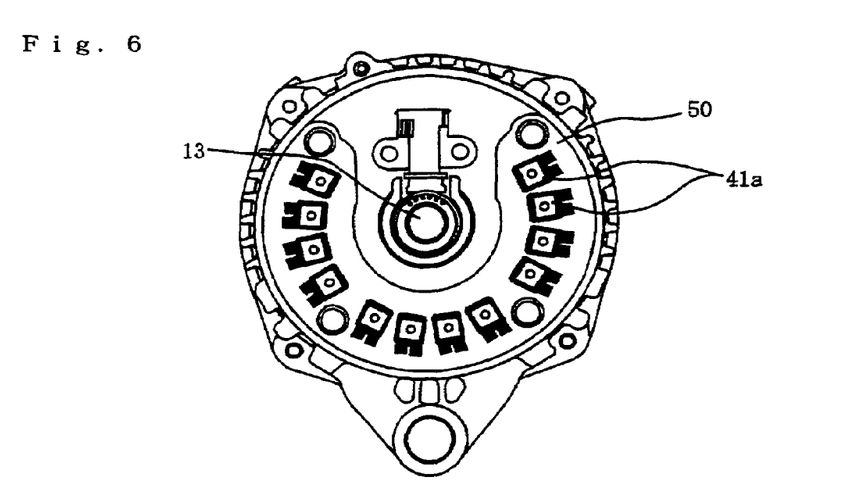
FIG. 6 is a top view of the power element unit 4 of FIG. 5.

FIG. 5 is a cross sectional view showing a structure of an electric rotating machine according to a second embodiment of the invention, and FIG. 6 is a view taken from the top of a power element unit 4. In the drawings, the same reference numerals indicate the same and like parts to those in FIGS. 1 and 2 described in the foregoing first embodiment. This second embodiment differs from the first embodiment in the aspect that ventilation holes 31a and 31b are not formed in the axial direction of the cover 30 and the rear bracket 11, but the ventilation holes 31a ad 31b are formed in a direction orthogonal to the axial direction, and that an upper-side heat sink 50 and a lower-side heat sink 51 are disposed with an insulating plate 59 sandwiched therebetween such that the power elements 41a and 41b are located in airflow courses F to be formed with these ventilation holes 31a and 31b respectively.

In this second embodiment, since the upper-side heat sink 50 and the lower-side heat sink 51 are disposed in a laminated manner via the plate-like insulator 59, it is possible to shorten a distance between the heat sinks, and thus to achieve downsizing. Furthermore, since the space at the power elements can be utilized as air courses, it is possible to contribute to improvement in cooling capability. Moreover, the power elements 41a and 41b to be mounted on the heat sinks 50 and 51 are disposed in parallel to the radial direction of the rotor 15, so that there is an advantage in that faces to which the power elements 41a and 41b are connected are cooled efficiently.

Embodiment 3

Figure 7:
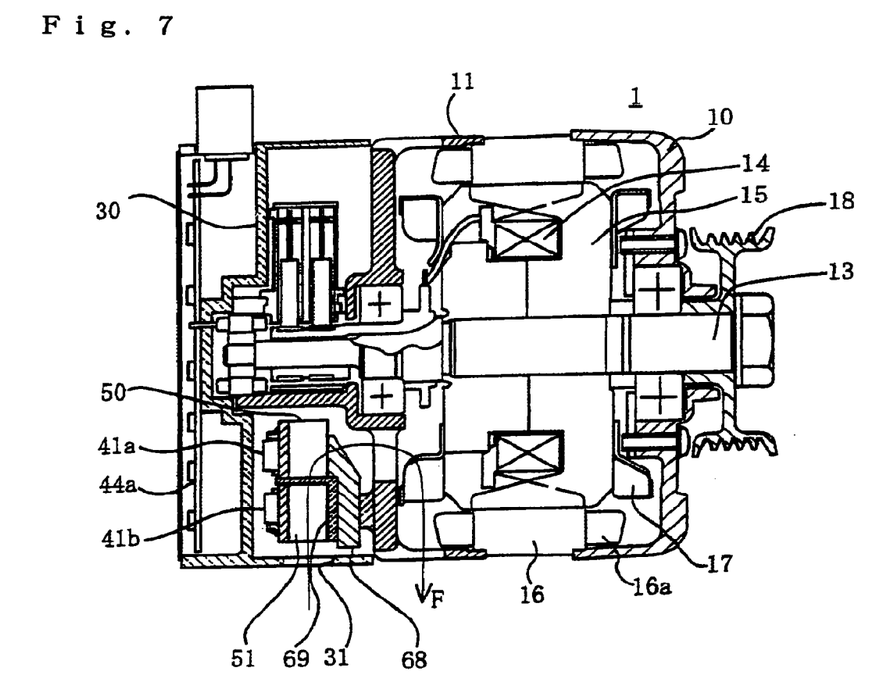
FIG. 7 is a cross-sectional view showing a structure of an electric rotating machine according to a third embodiment of the invention.
Figure 8:
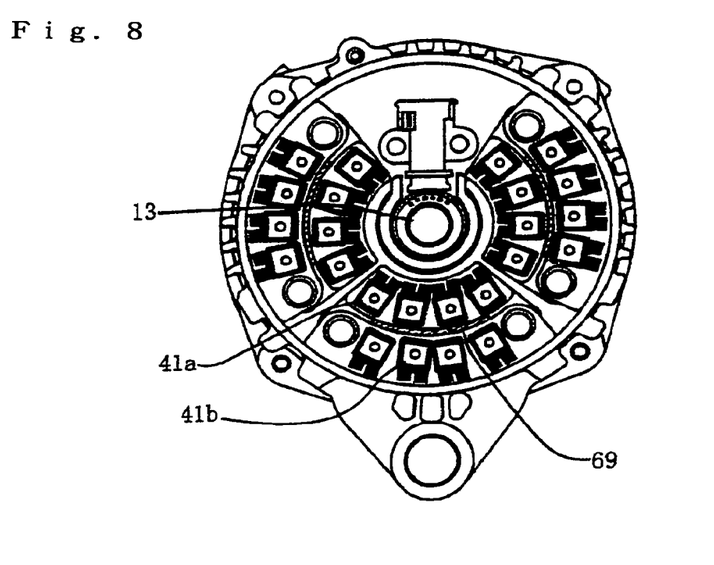
FIG. 8 is a top view of the power element unit 4 of FIG. 7.

FIG. 7 is a cross sectional view showing a structure of an electric rotating machine according to a third embodiment of the invention. FIG. 8 shows a view taken from the top of a power element unit 4. Only difference between this third embodiment and the foregoing second embodiment is that an upper-side heat sink and a lower-side heat sink 51 are disposed in the same line radially to be fixed to a heat sink mounting part 68, and insulation between these heat sinks is made with an insulator 69 to be in an integral structure.

In this third embodiment, since the upper-side heat sink 50 and the lower-side heat sink 51 are disposed in the same line radially, the face on the larger area side of radiator fines of the heat sinks 50 and 51 can be located linearly along the airflow course F. Consequently, such a construction provides advantages in ensuring a certain amount of air for cooling with one airflow course, and in obtaining an electric rotating machine of a small axial dimension.

Embodiment 4

Figure 9:
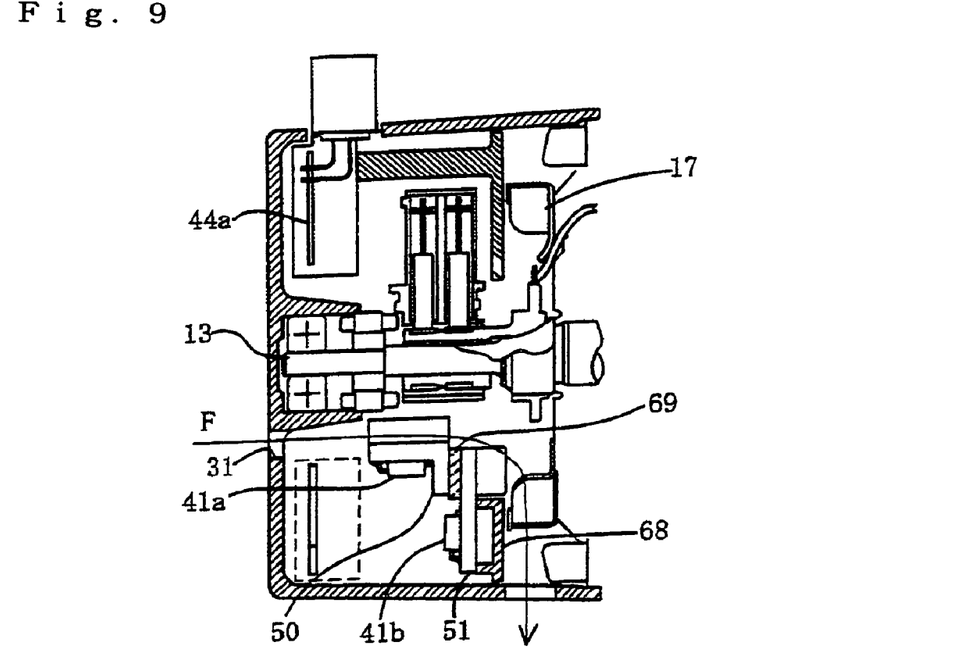
FIG. 9 is a cross-sectional view showing a structure of an electric rotating machine according to a fourth embodiment of the invention.
Figure 10:
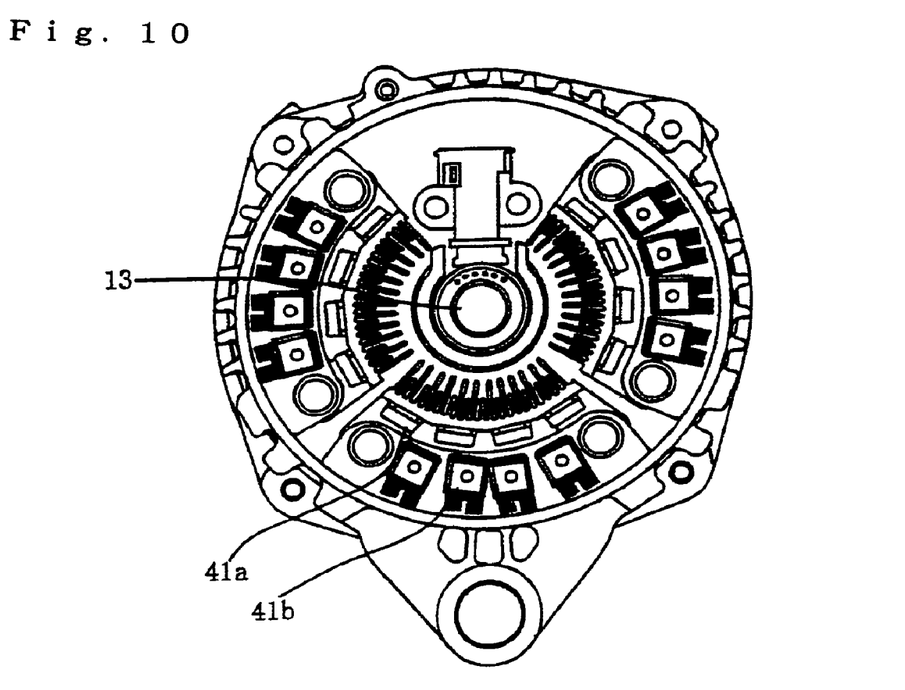
FIG. 10 is a top view of the power clement unit 4 of FIG. 9.

FIG. 9 is a cross sectional view showing a structure of an electric rotating machine according to a fourth embodiment of the invention, and FIG. 10 shows a view taken from the top of a power element unit 4. In this fourth embodiment, respective heat sinks are disposed adjacent to each other forming an L shape bent in an axial direction and in a radial direction of the rotary shaft. An insulator 69 is interposed between an upper-side heat sink 50 and a lower-side heat sink 51, and attached to a rear bracket (not shown) integrally with a mounting part 68.

Generally in the flow of a cooing air of an electric rotating machine, air is sucked in an axial direction and discharged in an outer diameter direction by the centrifugal force. In the L-shaped heat sink, the heat sinks can be disposed along the directions of suction and discharge, so that it is possible to decrease pressure drop of the air passage, and to efficiently cool the power elements. Consequently, there is an advantage of further downsizing.

Embodiment 5

Figure 11:
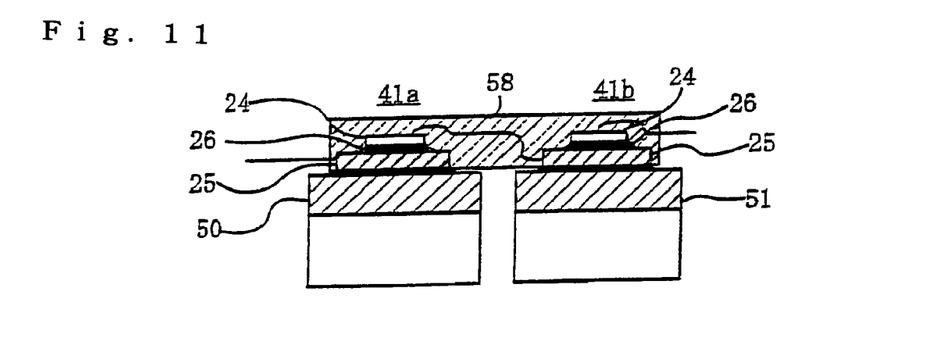
FIG. 11 is a cross-sectional view showing an example construction of a power module according to a fifth embodiment.
Figure 12:
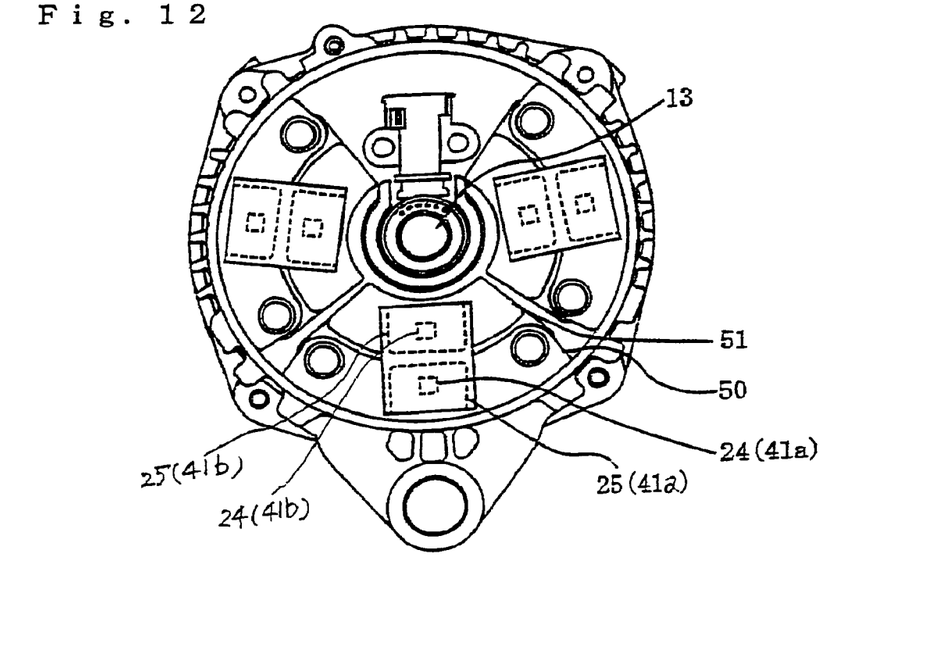
FIG. 12 is a top view of the power module of FIG. 11 when the power module is integrated into an electric rotating machine.

FIG. 11 is a cross sectional view showing an example of a construction of a power module according to a fifth embodiment of the invention. FIG. 12 is a view taken from the top in the state that the mentioned power module is integrated into an electric rotating machine.

Heat sinks according to this fifth embodiment are disposed independent of each other in the proximity. To these heat sinks, a component made by integral molding with an insulator 58 of chips 24 and 24 having preliminarily been directly connected by soldering onto heat spreaders 25 and 25 is joined by soldering, thereby forming a power module. In this manner, it is possible to handle MOS chips of the upper and lower arms as a TPM (Transfer Power Module) structure that is integrally packaged, providing an advantage that simplification in the manufacturing and assembling processes can be achieved.

Additionally, in the mentioned embodiments, electric rotating machines in which a field winding 14 and a brush holder 19 are mounted on a rotor 15 are described. The inventions, however, can be applied to any electric rotating machine 1 provided with no field winding 14 and brush holder 19 as well. Furthermore, although an inside heat sink 50 is shown to be constructed of three parts of U-phase section 60, V-phase section 70, and W-phase section 80, these sections are connected into one part, and power elements (switching elements) 41 of each upper arm of U-phase, V-phase, and W-phase are mounted onto the same heat sink, thereby enabling to achieve further rationalization of wiring assembly.

What is claimed is:

1. An electric rotating machine comprising;
an electric rotating machine section provided with a rotor including a rotary shaft and a stator including an armature winding that is disposed so as to surround said rotor; and a switching circuit section that is located in the proximity of said electric rotating machine section, and is provided with at least one pair of switching elements forming an upper arm and a lower arm to make a switching control of said electric rotating machine section;
wherein the switching elements of each arm of said switching circuit section are connected at respective drain terminals to individual heat sinks with no insulator interposed, and said individual heat sinks are made integral with each other via an insulator.

2. The electric rotating machine according to claim 1, wherein each of said heat sinks are disposed adjacent to each other in a radial direction of the rotary shaft, and cooling faces of respective heat sinks are located in parallel to an axial airflow course.

3. The electric rotating machine according to claim 1, wherein each of said heat sinks are disposed adjacent to each other in a rotary shaft direction via an insulator, and cooling faces of respective heat sinks are located in parallel to a radial airflow course.

4. The electric rotating machine according to claim 1, wherein each of said heat sinks are disposed adjacent to each other in a radial direction of the rotary shaft, and cooling faces of respective heat sinks are located in series parallel to a radial airflow course.

5. The electric rotating machine according to claim 1, wherein each of said heat sinks are disposed adjacent to each other forming an L shape along an axial direction and a radial direction of the rotary shaft, and cooling, faces of respective heat sinks are located in parallel along an airflow course bent from an axial direction to a radial direction.

6. The electric rotating machine according to claim 1, wherein said switching elements of the upper arm and said switching element of the lower arm are packaged in an integral structure with an insulator.

7. The electric rotating machine according to claim 1, wherein a plurality of the switching elements to be connected to each of said heat sinks are directly connected to the same heat sink, to form a plurality of parallel structures.

8. The electric rotating machine according to claim 1, wherein a capacitor for smoothing is disposed between a wiring board connected to a heat sink including a positive electrode potential and a wiring board connecting a negative electrode potential of each phase.

9. The electric rotating machine according to claim 8, wherein said capacitor for smoothing is provided in each phase.

* * * * *